United States Patent
Hosokawa et al.

(10) Patent No.: US 10,026,876 B2
(45) Date of Patent: Jul. 17, 2018

(54) LIGHT EMITTING DEVICE

(71) Applicant: NICHIA CORPORATION, Anan-shi, Tokushima (JP)

(72) Inventors: Shoji Hosokawa, Tokushima (JP); Sadakazu Wakui, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/234,249

(22) Filed: Aug. 11, 2016

(65) Prior Publication Data
US 2017/0054059 A1   Feb. 23, 2017

(30) Foreign Application Priority Data

Aug. 20, 2015 (JP) ................. 2015-163043
Jul. 12, 2016 (JP) ................. 2016-137685

(51) Int. Cl.
*H01L 33/50* (2010.01)
*H01L 33/32* (2010.01)

(52) U.S. Cl.
CPC ............ *H01L 33/504* (2013.01); *H01L 33/32* (2013.01); *H01L 2224/48091* (2013.01); *H01L 2224/48247* (2013.01); *H01L 2224/48257* (2013.01); *H01L 2224/73265* (2013.01); *H01L 2924/181* (2013.01)

(58) Field of Classification Search
None
See application file for complete search history.

(56) References Cited

U.S. PATENT DOCUMENTS

2009/0221783 A1   9/2009   Hawker et al.
2012/0056224 A1   3/2012   Mitsuishi et al.
(Continued)

FOREIGN PATENT DOCUMENTS

EP   2905818 A1   8/2015
JP   2009-203475 A   9/2009
(Continued)

OTHER PUBLICATIONS

"Narrow-band red-emitting Sr[LiAl3N4]:Eu2C as a next-generation LED-phosphor material" by Philipp Pust et al. Nature Materials | vol. 13 | Sep. 2014.*
(Continued)

*Primary Examiner* — Eric Ward
(74) *Attorney, Agent, or Firm* — Hunton Andrews Kurth LLP

(57) ABSTRACT

A light emitting device that includes a light emitting element having a peak emission wavelength at 400-480 nm and a fluorescent member can be provided. The fluorescent member includes a first fluorescent material that includes a nitride containing alkaline-earth metal, alkali metal, aluminum and europium, a second fluorescent material that includes a nitride containing alkaline-earth metal, aluminum, silicon and europium, and a third fluorescent material having a peak emission wavelength in a range of from 500 nm to 560 nm. A content of the first fluorescent material to a total content of the first fluorescent material and the second fluorescent material is from 5% by mass to 95% by mass.

14 Claims, 7 Drawing Sheets

(56) References Cited

U.S. PATENT DOCUMENTS

| | | | | |
|---|---|---|---|---|
| 2012/0313124 A1* | 12/2012 | Clatterbuck | ....... | C09K 11/7774 257/98 |
| 2013/0257266 A1* | 10/2013 | Ishizaki | ................ | H01L 33/504 313/503 |
| 2015/0123155 A1 | 5/2015 | Schmidt et al. | | |
| 2015/0159085 A1 | 6/2015 | Izawa et al. | | |
| 2016/0316527 A1* | 10/2016 | Allen | ...................... | F21V 23/04 |
| 2016/0372638 A1* | 12/2016 | Todorov | ................ | H01L 33/504 |

FOREIGN PATENT DOCUMENTS

| | | |
|---|---|---|
| JP | 2012-077289 A | 4/2012 |
| JP | 2012-124356 A | 6/2012 |
| JP | 2015-061009 A | 3/2015 |
| JP | 2015-526532 A | 9/2015 |
| WO | 2013-175336 A1 | 11/2013 |
| WO | 2014-054290 A1 | 4/2014 |
| WO | 2015-044106 A1 | 4/2015 |

OTHER PUBLICATIONS

Watanabe Hiromu et al., Synthetic Method and Luminescence Properties of SrxCa1-xAlSiN3: Eu2+ Mixed Nitride Phosphors, Journal of The Electroch emical Society, Electrochemical Society, Jan. 15, 2008, 155 (3), F31-F36.

Pust Philipp et al. Ca[LiAl3N4]:Eu2+—A Narrow-Band Red-Emitting Nitridolithoaluminate, Chemistry Materials, USA, ACS Publication, May 9, 2014, vol. 26, No. 11, 3544-3549.

Peng Mingying et al., Investigations on Valence-Change Behaviors of Europium Ions in Eu-Doped Aluminate and Silicate Phosphors, Journal of Rare Earths, NE, Elsevier, Dec. 2006, vol. 24, Issue 6, 749-753.

* cited by examiner

LIGHT EMITTING DEVICE

CROSS-REFERENCE TO RELATED APPLICATION

This application claims priority to Japanese Patent Application No. 2015-163043, filed on Aug. 20, 2015 and Japanese Patent Application No. 2016-137685, filed on Jul. 12, 2016, the entire disclosures of which are incorporated herein by reference.

BACKGROUND OF THE INVENTION

Field of the Invention

The present disclosure relates to a light emitting device.

Description of the Related Art

Light emitting devices including, in combination, a light source, and a wavelength conversion member, which is capable of emitting light with hues different from the hue of the light source when excited by the light from the light source, and thus being capable of emitting light of various hues owing to the principle of the mixture of colors of light, are being developed. In particular, light emitting devices composed of a light emitting diode ("LED") combined with a fluorescent material are increasingly and widely utilized, for example, as lighting systems or as backlights for liquid crystal displays. For instance, in a light emitting device that emits white mixed color light, a fluorescent material that emits light at short wavelengths, such as blue-green, green, and yellow-green, and a fluorescent material that emits light at long wavelengths, such as orange and red, may be combined, for example, to allow liquid crystal displays to have an improved color reproduction range and lighting systems to have an improved color rendering.

As fluorescent materials with less reduction in luminance when excited at high energy, fluorescent materials that have a nitrogen-containing inorganic crystal as a host crystal in the crystalline structure, such as sialon fluorescent materials, oxynitride fluorescent materials, and nitride fluorescent materials, have been proposed. Of these, as examples of nitride fluorescent materials, $Eu^{2+}$-activated red fluorescent materials having $CaAlSiN_3$ as a host crystal (hereinafter referred to as "CASN fluorescent materials") and (Sr,Ca)$AlSiN_3$:Eu, which is a CASN fluorescent material in which a part of Ca is replaced with Sr (hereinafter referred to as "SCASN fluorescent material") is known. CASN fluorescent materials and SCASN fluorescent materials have a peak emission wavelength in a range as wide as from 610 to 680 nm. The half bandwidth of these light emission spectra is from 75 to 95 nm.

As an example of nitride fluorescent materials having a narrow half bandwidth of 70 nm or less, $SrLiAl_3N_4$:Eu (hereinafter referred to as "SLAN fluorescent material") has recently been proposed. The peak emission wavelength of this compound is around 650 nm (see, e.g., WO 2013/175336 A1 and Nature Materials, NMAT4012, 2014).

SUMMARY OF INVENTION

A light emitting device that includes a light emitting element having a peak emission wavelength in a range of from 400 nm to 480 nm and a fluorescent member can be provided. The fluorescent member includes a first fluorescent material that includes a nitride red phosphor containing alkaline-earth metal, alkali metal, aluminium and europium, a second fluorescent material that includes a nitride red phosphor containing alkaline-earth metal, aluminium, silicon and europium, and a third fluorescent material having a peak emission wavelength in a green range of from 500 nm to 560 nm. A content of the first fluorescent material to a total content of the first fluorescent material and the second fluorescent material is from 5% by mass to 95% by mass. The light emitting device can exhibit superior color rendering and high luminosity factor.

DETAILED DESCRIPTION OF THE EMBODIMENT

Figure 1:
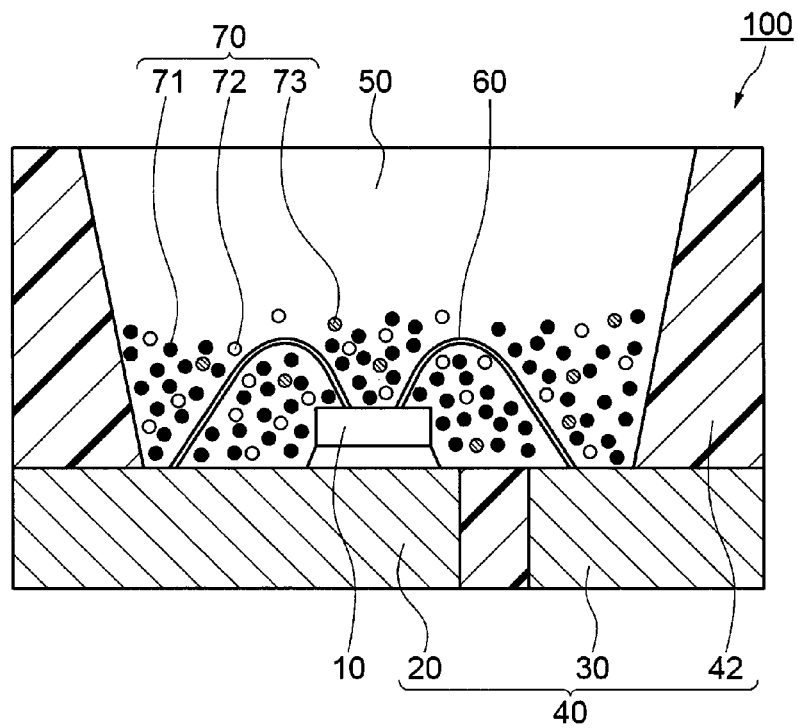
FIG. 1 is a schematic sectional view of an example of a light emitting device according to the present embodiment.

The light emitting device according to the present disclosure will be described below with reference to embodiments. The embodiments shown below, however, merely exemplify the technical concept of the present disclosure, and the present disclosure is not limited to those illustrated below. The relationship between the color names and the chromaticity coordinates, the relationship between the wavelength ranges of light and the color names of monochromatic light, and others are in accordance with Japanese Industrial Standard (JIS) Z8110. Further, for the amount of each component contained in a composition, when a plurality of substances corresponding to the component exist, the amount of the component means the total amount of the substances present in the composition unless otherwise specified. The average particle size of the first fluorescent material is a numerical value called Fisher Sub Sieve Sizer's No., and measured by using the air permeability method. The half bandwidth of a fluorescent material indicates a wavelength width of a light emission spectrum at 50% of the maximum light emission intensity in a light emission spectrum of the fluorescent material.

[Light Emitting Device]

The light emitting device of one embodiment includes a light emitting element having a peak emission wavelength in a range of from 400 nm to 480 nm and a fluorescent member. The fluorescent member includes a first fluorescent material that includes a nitride containing alkaline-earth metal, alkali metal, aluminium, and europium; a second fluorescent material that includes a nitride containing alkaline-earth metal, aluminium, silicon, and europium; and a third fluorescent material having a peak emission wavelength in a range of from 500 nm to 560 nm. A content of the first fluorescent material to a total content of the first fluorescent material and the second fluorescent material is from 5% by mass to 95% by mass.

The light emitting device of the embodiment includes a light emitting element having a specific peak emission wavelength, at least two types of red light-emitting nitride fluorescent materials each having a different composition, and a green-light emitting fluorescent material in combination. This allows the light emitting device to control light emitting components in the red region of the light emission spectrum. Specifically, while a first fluorescent material having a longer peak emission wavelength and a narrower half bandwidth than a second fluorescent material reduces long-wave components of low luminosity factor in the light emission spectrum of the light emitting device, the second fluorescent material having a shorter peak emission wavelength and a wider half bandwidth than the first fluorescent material widely covers light emitting components in the red region of the light emission spectrum of the light emitting device. The light emitting device of the embodiment including such a first fluorescent material and a second fluorescent material achieves superior color rendering and high luminosity factor.

By applying a light emitting device of the embodiment to, for instance, a lighting apparatus, a lighting apparatus with superior color rendering can be provided. Color rendering is, for instance, represented by an average rendering index (Ra), which is an indicator of how the color of an illuminated object appears. In 1986, Commission internationale de l'éclairage (CIE) published guidelines for color rendering which fluorescent lamps or the like should comply with. According to the guidelines, desirable Ra according to the place of usage is as follows: from 60 to less than 80 for factories for general operations; from 80 to less than 90 for homes, hotels, restaurants, shops, offices, schools, hospitals, factories for precision work, or the like; and above 90 for clinical test laboratories, art galleries, or the like. The special color rendering indexes are the results of evaluations of R9 to R15. Of these, R9 is a standard for the appearance of saturated red. In an environment where meats are handled, a rendering index of R9 is often used, and the higher the index, the more desirable.

The average rendering index Ra of the light emitting device of the embodiment may be, for instance, 80 or more, 85 or more, 90 or more, or 95 or more. The upper limit of Ra is 100. R9 of the light emitting device of the embodiment may be, for instance, 30 or more, 35 or more, 50 or more, or 75 or more. The upper limit of R9 is 100.

The light emitting device emits light resulting from a mix of light from the light emitting element and fluorescence from the first fluorescent material, the second fluorescent material, and the third fluorescent material. The light may be, for instance, included in the range defined by chromaticity coordinates of CIE 1931: x=0.330 to 0.500 and y=0.330 to 0.450. The correlated color temperature of light emitted by the light emitting device may be, for instance, from 2700 K to 6500 K.

Examples of the forms of the light emitting device include through-hole mounting and surface mounting types. In through-hole mounting, a light-emitting device is fixed to a mount board by placing leads of the light-emitting device into through-holes formed in the mount board. In contrast, with surface mounting, the leads of the light-emitting device are fixed to the surface of the mount board.

A light emitting device 100 according to an embodiment of the present disclosure will be explained with reference to the drawings. FIG. 1 is a schematic cross-sectional view of a light emitting device 100. The light emitting device 100 is an example of a surface-mounted light emitting device.

The light emitting device 100 includes a light emitting element 10, which is composed of a gallium nitride compound semiconductor that emits visible light at short wavelengths (e.g., 380 nm to 485 nm) and has a peak emission wavelength in the range of from 430 nm to 470 nm, and a molded body 40 on which the light emitting element 10 is disposed. The molded body 40 includes a first lead 20, a second lead 30, and a resin portion 42, which are formed in an integral manner. The molded body 40 may be formed with ceramics member instead of the resin portion 42 by using known method. The molded body 40 has a recess defined by a bottom surface and side surfaces, and the light emitting element 10 is disposed on the bottom surface of the recess. The light emitting element 10 has a pair of electrodes, positive and negative, and the positive and negative electrodes are electrically connected to the first lead 20 and the second lead 30, respectively, with a wire 60. The light emitting element 10 is covered with a fluorescence member 50. The fluorescence member 50, for example, is composed of such a resin and a fluoride fluorescent material 70 that converts the wavelength of light emitted from the light emitting element 10. The fluorescent material 70 contains a first fluorescent material 71, a second fluorescent material 72, and a third fluorescent material 73.

The fluorescence member 50 serves not only as a member including a fluorescent material 70 for converting the wavelength, but also as a member for protecting the light emitting element 10 and the fluorescent material 70 from the outside environment. In FIG. 1, the particles of the fluorescent material 70 are unevenly dispersed in the fluorescence member 50. Arranging the particles of the fluorescent material 70 closer to the light emitting element 10 in this manner allows efficient conversion of the wavelength of light from the light emitting element 10, thereby providing a light emitting device with superior light emitting efficiency. It should be noted that the arrangement of the particles of the fluorescent material 70 and the light emitting element 10 in the fluorescence member 50 is not limited to one in which they are in close proximity to each other, and the particles of the fluorescent material 70 may be arranged spaced apart from the light emitting element 10 within the fluorescence member 50 to avoid the influence of heat on the fluorescent material 70. The particles of the fluorescent material 70 may also be approximately evenly dispersed in the entire fluorescence member 50 so as to obtain light with further reduced color unevenness.

Figure 2:
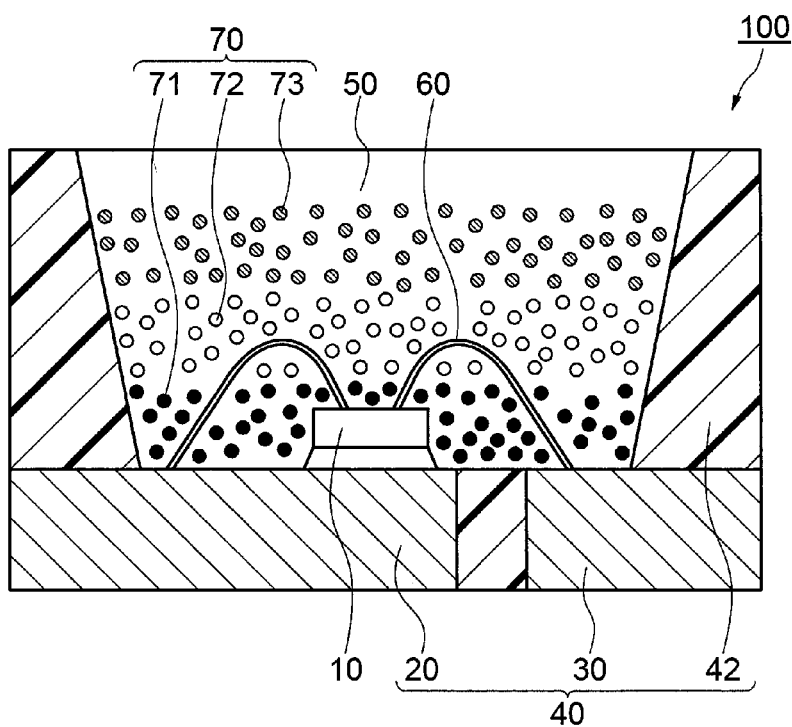
FIG. 2 is a schematic sectional view of another example of a light emitting device according to the present embodiment.

Although in FIG. 1, the particles of the fluorescent material 70, or specifically, particles of a first fluorescent material 71, a second fluorescent material 72, and a third fluorescent material 73 are in a mixed state, the fluorescent material particles 71, 72, and 73 may be substantially separately arranged from one another as shown in FIG. 2. FIG. 2 is a schematic sectional view of another example of a light emitting device according to the present embodiment. In FIG. 2, a first fluorescent material 71, a second fluorescent material 72, and a third fluorescent material 73 are arranged closer to the light emitting element 10 in the recited order. This arrangement can minimizes excitement of the first fluorescent material 71 and the second fluorescent material 72 by the emission of light from the third fluorescent material 73. Arranging the third fluorescent material 73 uppermost also allows the emission of light from the third fluorescent material 73 to be easily taken out from the light emitting device. Although the first fluorescent material 71, the second fluorescent material 72, and the third fluorescent material 73 are rather separately arranged in FIG. 2, the first fluorescent material 71 and the second fluorescent material 72 may be arranged in a mixed state, and the third fluorescent material may be arranged thereon.

(Light Emitting Element)

The peak emission wavelength of the light emitting element lies in the range of from 430 nm to 470 nm, or in the range of from 445 nm to 455 nm for luminosity factor. Using a light emitting element having a peak emission wavelength in this range as an excitation light source yields a light emitting device that emits light resulting from a mix of the light from the light emitting element and fluorescence from the fluorescent materials. In addition, because this allows effective use of light radiated from the light emitting element to the outside, the loss of light emitted from the light emitting device can be minimized, resulting in a highly efficient light emitting device.

The half bandwidth of the light emission spectrum of the light emitting element may be, for example, 30 nm or less.

The light emitting element preferably uses a semiconductor light emitting element, such as an LED. Using a semiconductor light emitting element as the excitation light source yields a highly efficient light emitting device that has high output linearity to the input and is resistant and stable to mechanical impact.

For example, a semiconductor light emitting element that includes a nitride semiconductor ($In_XAl_YGa_{1-X-Y}N$, $0 \leq X$, $0 \leq Y$, $X+Y \leq 1$), which emits blue or green light, may be used as the semiconductor light emitting element.

(Fluorescent Member)

The fluorescent member includes at least one first fluorescent material that emits red light, at least one second fluorescent material that emits red light, and at least one third fluorescent material that emits green light by absorbing light emitted from the light emitting element and the content of the first fluorescent material to the total content of the first fluorescent material and the second fluorescent material is from 5% by mass to 95% by mass. The first fluorescent material and the second fluorescent material each have a different composition. By appropriately selecting the component ratio of the first fluorescent material, the second fluorescent material, and the third fluorescent material (hereinafter simply and collectively referred to as "fluorescent materials"), the properties such as luminosity factor and color rendering of the light emitting device may fall within the desired ranges. The fluorescent member may contain, for instance, fluorescent materials and resin.

First Fluorescent Material

The fluorescent member includes at least one first fluorescent material that includes a nitride containing alkaline-earth metal, alkali metal, aluminium and europium, and being a red phosphor. The first fluorescent material may have, for instance, a composition represented by (I):

$$M^a{}_xM^b{}_yAl_3N_z:Eu \quad (I)$$

In formula (I), $M^a$ is at least one element selected from the group consisting of Ca, Sr, and Ba, and may contain at least one of Sr and Ca, or at least Sr. When $M^a$ contains at least one of Ca and Sr, the total mole ratio of Ca and Sr contained in $M^a$ may be, for instance, 85% by mole or more, or 90% by mole or more.

$M^b$ is at least one element selected from the group consisting of Li, Na, and K, and may contain at least Li. When $M^b$ contains Li, the mole ratio of Li contained in $M^b$ may be, for instance, 80% by mole or more, or 90% by mole or more.

In the formula, x satisfies $0.5 \leq x \leq 1.5$, and may satisfy $0.6 \leq x \leq 1.2$, or $0.8 \leq x \leq 1.1$; y satisfies $0.5 \leq y \leq 1.2$, and may satisfy $0.6 \leq y \leq 1.1$, or $0.6 \leq y \leq 1.05$; and z satisfies $3.5 \leq z \leq 4.5$, or $3.6 \leq z \leq 4.4$.

The compositional ratio of Eu may be, for instance, from 0.002 to 0.020, or 0.005 to 0.015, when the compositional ratio of 3 of aluminium is taken as a reference, for luminosity factor.

As an amount of impurities contained in the first fluorescent material, the content of oxygen considered to be derived from raw materials and the atmosphere may be 2.5% by weight or less. When raw materials include a fluorine-containing compound as a flux, which is described later, the content of fluorine in the first fluorescent material may be 1.0% by weight or less.

The half bandwidth in the light emission spectrum of the first fluorescent material may be, for instance, 70 nm or less, 65 nm or less, 60 nm or less, or 55 nm or less. The half bandwidth may also be, for instance, 40 nm or more, 45 nm or more, or 50 nm or more.

The first fluorescent material may have a maximum excitation wavelength, for instance, in the range of 400 nm to 570 nm, or in the range of 420 nm to 460 nm. The first fluorescent material may have a peak emission wavelength, for instance, in the range of 630 nm to 670 nm, or in the range of 640 nm to 660 nm.

In the first fluorescent material, europium (Eu), which is a rare earth, may be a light emission center. However, the light emission center in the first fluorescent material may not be limited only to europium, and a part thereof may be replaced with another rare earth metal or alkaline earth metal, and co-activated with Eu. $Eu^{2+}$, which is a divalent rare-earth ion, will stably be present and exert the effect of emitting light if an appropriate host is selected.

The mean particle diameter of the first fluorescent material may be, for instance, 2 μm to 30 μm, or 3 μm to 25 μm for luminosity factor. The larger the mean particle diameter, the higher the absorption rate of excitation light and the luminosity factor are likely to be. In this manner, including a first fluorescent material having superior optical properties into the light emitting device allows the light emitting device to have a further improved luminosity factor. The first fluorescent material may contain fluorescent material particles having the above-described mean particle diameter value at high frequency. That is, the particle sizes may be distributed in a narrow range. Using a fluorescent material having less variation in particle size distribution allows a light emitting device to have further minimized color unevenness and more favorable color tones.

The content of the first fluorescent material in the fluorescent member may be, for instance, from 0.1 part by mass to 30 parts by mass, or 0.5 part by mass to 25 parts by mass, relative to 100 parts by mass of the resin used.

Second Fluorescent Material

The fluorescent member contains at least one second fluorescent material that includes a nitride containing alkaline-earth metal, aluminium, silicon and europium, and being a red phosphor. The second fluorescent material may have, for instance, a composition represented by formula (II):

$$Sr_sCa_tAl_uSi_vN_w:Eu \qquad (II)$$

In formula (II), s, t, u, v, and w respectively satisfy $0.0 \leq s < 1.0$, $0.0 < t \leq 1.0$, $s+t \leq 1.0$, $0.9 \leq u \leq 1.1$, $0.9 \leq v \leq 1.1$, and $2.5 \leq w \leq 3.5$.

For luminosity factor, the compositional ratio of Eu may be, for instance, from 0.002 to 0.04, or from 0.004 to 0.03, when the sum of the compositional ratio of Sr and the compositional ratio of Ca (s+t=1.0) is taken as a reference.

As an amount of impurities contained in the second fluorescent material, the content of oxygen considered to be derived from raw materials and the atmosphere may be 1.5% by weight or less. When raw materials include a fluorine-containing compound as a flux, which is described later, the content of fluorine may be 0.5% by weight or less.

The half bandwidth in the light emission spectrum of the second fluorescent material may be, for instance, 70 nm or more, or 75 nm or more. The half bandwidth may also be, for instance, 100 nm or less, 95 nm or less, or 85 nm or less.

The second fluorescent material may have an excitation spectrum with some intensity in the range of at least from 400 nm to 480 nm so that the second fluorescent material is readily excited by light from a light emitting element having a peak emission wavelength in a range of from 400 nm to 480 nm. The second fluorescent material may have a peak emission wavelength, for instance, in the range of from 600 nm to 655 nm, or in the range of from 605 nm to 650 nm.

The half bandwidth of the first fluorescent material may be narrower than the half bandwidth of the second fluorescent material. This facilitates adjustment of the light emission spectrum in the red region to a desirable mode. The ratio of the half bandwidth of the first fluorescent material to the half bandwidth of the second fluorescent material (the first fluorescent material/the second fluorescent material) may be, for instance, from 0.5 to 0.9, or 0.6 to 0.8. The difference in half bandwidth between the second fluorescent material and the first fluorescent material may be, for instance, from 15 nm to 50 nm, or from 20 nm to 45 nm.

The peak emission wavelength of the first fluorescent material may be equal to or longer than the peak emission wavelength of the second fluorescent material, or may be longer than the peak emission wavelength of the second fluorescent material. The peak emission wavelength of the first fluorescent material being longer than the peak emission wavelength of the second fluorescent material and the half bandwidth of the first fluorescent material being shorter than the half bandwidth of the second fluorescent material facilitates adjustment of the light emission spectrum in the red region to a desired mode. When there is a difference in peak emission wavelength between the first fluorescent material and the second fluorescent material, the difference may be larger than 0 nm, and may be, for instance, 55 nm or less, or 45 nm or less.

The mean particle diameter of the second fluorescent material may be, for instance, from 2 μm to 30 μm, or from 3 μm to 25 μm or less, for luminosity factor.

The content of the second fluorescent material in the fluorescent member may be, for instance, from 0.1 part by mass to 25 parts by mass, or from 0.5 part by mass to 20 parts by mass, relative to 100 parts by mass of resin.

The content of the first fluorescent material relative to the total content of the first fluorescent material and the second fluorescent material in the fluorescent member is, from 5% by mass to 95% by mass. Setting the content of the first fluorescent material to a predetermined value or more is likely to result in further improved color rendering. On the other hand, setting the content of the first fluorescent material to a predetermined value or less is likely to result in improved luminosity factor. For these reasons, to achieve both superior color rendering and high luminosity factor, the content of the first fluorescent material relative to the total content of the first fluorescent material and the second fluorescent material in the fluorescent member may be from 30% by mass to 90% by mass, or from 40% by mass to 70% by mass.

Third Fluorescent Material

The fluorescent member includes at least one third fluorescent material having a peak emission wavelength in the range of from 500 nm to 560 nm. Including a third fluorescent material in addition to a first fluorescent material and a second fluorescent material allows emission of light of a desired color.

The half bandwidth of the light emission spectrum of the third fluorescent material may be, for instance, 90 nm or more, or 95 nm or more. The half bandwidth may also be, for instance, 125 nm or less, or 120 nm or less. The half bandwidth of the third fluorescent material being in a predetermined range allows even superior color rendering.

The third fluorescent material may have a peak emission wavelength in the range of from 500 nm to 560 nm, or from 505 nm to 555 nm. The third fluorescent material may have a maximum excitation wavelength in the range of, for instance, from 420 nm to 480 nm, or from 430 nm to 470 nm.

Specifically, the third fluorescent material may contain one or more fluorescent materials having a composition represented by formula (IIIa) or (IIIb).

$$Ln_3Al_{5-p}Ga_pO_{12}:Ce \qquad (IIIa)$$

In formula (IIIa), Ln is at least one element selected from the group consisting of Y, Lu, Gd, and Tb, and p satisfies $0.0 \leq p \leq 3.0$.

$$La_{3-q}X_qSi_6N_{11}:Ce \qquad (IIIb)$$

In formula (IIIb), q satisfies $0.0 \leq q \leq 1.5$.

The activating amount of Ce in the fluorescent material having a composition represented by formula (IIIa) or (IIIb) may be, for instance, from 0.001 to 0.3 relative to 3 of Ln in formula (IIIa), and from 0.01 to 1.0 relative to 6 of Si in formula (IIIb).

The mean particle diameter of the third fluorescent material in the fluorescent member is equal to or greater than a predetermined value, light absorption of the fluorescent material is likely to increase, resulting in further improved luminosity factor. On the other hand, when a mean particle diameter is a predetermined value or less, variations in chromaticity among light emitting devices to be produced are likely to be further minimized. To strike a balance between the two, the mean particle diameter of the third fluorescent material may be from 2 μm to 35 μm, or from 3 μm to 30 μm.

The content of the third fluorescent material in the fluorescent member may be, for instance, from 10 parts by mass to 200 parts by mass, or from 20 parts by mass to 180 parts by mass, relative to 100 parts by mass of resin.

The content by mass of the third fluorescent material relative to the total content of the first fluorescent material and the second fluorescent material in the fluorescent member may be, for instance, from 50% to 2000%, or from 100% to 1700%, for easy adjustment to the intended color temperature. When the fluorescent material in the fluorescent member consists of a first fluorescent material, a second fluorescent material, and a third fluorescent material, the content by mass of the third fluorescent material relative to the total content of the first fluorescent material and the second fluorescent material in the fluorescent member may be, for instance, from 300% to 1800%, or from 400% to 1700%, for easy adjustment to the intended color temperature. The mass ratio of the third fluorescent material can further vary depending on, for example, the color temperature of the light emitting device or the specific gravity of the fluorescent materials. For instance, in a region where the color temperature is high, the ratio of the third fluorescent material may be increased, whereas in a region where the color temperature is low, the ratio of the third fluorescent material may be lowered.

Furthermore, when, for instance, the specific gravity of the fluorescent material is great, the volume ratio of the fluorescent material is small, so that the weight ratio of the fluorescent material is likely to be greater. For instance, when a color temperature being 4000 K and a specific gravity of the fluorescent material being 5.5 g/cm³ are taken as a border, when the color temperature is greater than 4000 K and the specific gravity is 5.5 g/cm³ or more, the content of the third fluorescent material may be, for instance, from 1000% to 1800%, or from 1100% to 1700%. When the color temperature is greater than 4000 K and the specific gravity is less than 5.5 g/cm³, the content of the third fluorescent material may be, for instance, from 1000% to 1700%, or from 1100% to 1600%. When the color temperature is 4000 K or less and the specific gravity is 5.5 g/cm³ or more, the content of the third fluorescent material may be, for instance, from 500% to 1300%, or from 600% to 1200%. When the color temperature is 4000 K or less and the specific gravity is less than 5.5 g/cm³, the content of the third fluorescent material may be, for instance, from 300% to 1200%, or from 400% to 1100%.

Fourth Fluorescent Material

The fluorescent member may contain at least one fourth fluorescent material having a peak emission wavelength in the range of from 485 nm to 540 nm. By further containing such a fourth fluorescent material, a specific light emitting component in the light emission spectrum of the light emitting device that may be insufficient only with the third fluorescent material may be covered by the light emitting component of the fourth fluorescent material, resulting in a light emitting device having even superior color rendering.

The fourth fluorescent material may have a peak emission wavelength in a range of from 480 nm to 540 nm, or in a range of from 485 nm to 530 nm.

The half bandwidth of the light emission spectrum of the fourth fluorescent material may be, for instance, 80 nm or less, or 75 nm or less. The half bandwidth may also be, for instance, 40 nm or more, or 50 nm or more. The half bandwidth of the fourth fluorescent material being a predetermined value or more is likely to prevent the light emission spectrum of the light emitting device from containing a certain specific light emitting component in an unbalanced manner. On the other hand, when the half bandwidth of the fourth fluorescent material is a predetermined value or less, overlapping with the light emission spectrum of the third fluorescent material, which has a relatively wider half bandwidth, is likely to be minimized. Adjusting the light emitting properties of the fourth fluorescent material by taking the light emission spectrum of the third fluorescent material into account in this manner allows the light emitting device to have further improved color rendering and luminosity factor.

The fourth fluorescent material may have an excitation spectrum with a certain level of intensity in the range of at least from 400 nm to 480 nm so that the second fluorescent material is readily excited by light from a light emitting element having a peak emission wavelength in a range of from 400 nm to 480 nm.

Specifically, the fourth fluorescent material may contain one or more fluorescent materials having a composition represented by formula (IVa), (IVb), or (IVc) to achieve even superior color rendering.

$$M^c{}_8MgSi_4O_{16}X_2{:}Eu \tag{IVa}$$

In formula (IVa), $M^c$ is at least one element selected from the group consisting of Ca, Sr, and Ba; and X is at least one element selected from the group consisting of Cl, F, and Br.

$$M^d{}_4Al_{14}O_{25}{:}Eu \tag{IVb}$$

In the formula, $M^d$ is at least one element selected from the group consisting of Ca, Sr, and Ba.

$$M^e{}_2SiO_4{:}Eu \tag{IVc}$$

In formula (IVc), $M^e$ is at least one element selected from the group consisting of Ca, Sr, Ba, and Mg.

The activating amount of Eu in the fluorescent material having a composition represented by formula (IVa), (IVb), or (IVc) may be, for instance, from 0.05 to 1.0 relative to 8 of $M^c$ in formula (IVa), and from 0.1 to 1.0 relative to 4 of $M^d$ in formula (IVb), and from 0.01 to 0.4 relative to 2 of $M^e$ in formula (IVc).

The mean particle diameter of the fourth fluorescent material in the fluorescent member may be a predetermined value or more, light absorption of the fluorescent material is likely to increase, resulting in further improved luminosity factor. On the other hand, when a mean particle diameter is a predetermined value or less, variations in chromaticity among light emitting devices to be produced are likely to be minimized. For these reasons, the mean particle diameter of the fourth fluorescent material may be, for instance, from 2 μm to 35 μm, or from 3 μm to 30 μm.

The content of the fourth fluorescent material in the fluorescent member may be, for instance, from 0.1 part by mass to 100 parts by mass, or 0.2 part by mass to 80 parts by mass, relative to 100 parts by mass of resin. The content of the fourth fluorescent material being in the above-described range will result in even superior color rendering.

The content by mass of the fourth fluorescent material relative to the total content of the third fluorescent material in the fluorescent member may be, for instance, from 1% by mass to 200% by mass, or from 5% by mass to 180% by mass. The content of the fourth fluorescent material being in the above-described range will result in even superior color rendering. When, for instance, the third fluorescent material has a composition represented by formula (IIIa) and the fourth fluorescent material has a composition represented by formula (IVa), the content by mass of the fourth fluorescent material relative to the total content of the third fluorescent material may be, for instance, from 1% by mass to 200% by mass, or 5% by mass to 180% by mass. Furthermore, when, for instance, the third fluorescent material has a composition represented by formula (IIIa) and the fourth fluorescent material has a composition represented by formula (IVb), the content by mass of the fourth fluorescent material relative to the total content of the third fluorescent material may be, for instance, from 5% by mass to 160% by mass, or from 10% by mass to 140% by mass.

Other Fluorescent Materials

The light emitting device may contain another fluorescent material in addition to the first fluorescent material, the second fluorescent material, the third fluorescent material and the forth fluorescent material as necessary. Examples of the other fluorescent material include $Ca_3Sc_2Si_3O_{12}$:Ce, $CaSc_2O_4$:Ce, $(Ba,Sr,Ca)Si_2O_2N_2$:Eu, $(Ca,Sr,Ba)_3Si_6O_{12}N_2$:Eu, $Si_{6-z}Al_zO_zN_{8-z}$:Eu(0<z≤4.2), $(Ca,Sr,Ba)Ga_2S_4$:Eu, $(Ca,Sr,Ba)_2Si_5N_8$:Eu, $(Ca,Sr,Ba)S$:Eu, and $K_2(Si,Ti,Ge)F_6$:Mn. When the light emitting device contains another fluorescent material, the content may be, for instance, 10% by mass or less, or 1% by mass or less, relative to the total amount of the fluorescent materials.

The method for producing the above-described fluorescent material is, for instance, as described below. Elemental substances, oxide, carbonate, nitride, chloride, fluoride, or sulfide of elements contained in the composition of the fluorescent material are used as raw materials, and each of these raw materials are weighed so as to have a predetermined compositional ratio. Furthermore, additive materials such as flux are further added to raw materials as appropriate, and the materials are dry-mixed or wet-mixed using a mixer. When a flux is added, the flux is, for instance, a fluoride of an alkaline-earth metal, such as barium fluoride. The content may be, in the case of the above-described first fluorescent material, 0.01% by weight to 1.5% by weight in fluorine equivalent terms. In the case of the above-described second fluorescent material, the content may be 1.5% by weight or less in fluorine equivalent terms. This will facilitate a solid-phase reaction resulting in formation of particles of a uniform size.

As a mixer, a pulverizer may be used. Examples of suitable pulverizers include a vibrational mill, a roll mill, and a jet mill, in addition to a ball mill, which is conventionally used in the industry. The specific surface area may also be increased by grinding the mixture using a pulverizer. To prepare a powder having a specific surface area within a certain range, the particles may be classified using a conventional separator or classifier. Examples of such a separator include a wet separator such as a sedimentation tank, a hydrocyclone, and a centrifugal separator. Examples of such a classifier include a dry classifier such as a cyclone and an air separator. The resultant mixed materials are filled into a crucible made of, for example, SiC, quartz, alumina, or BN, and calcined in an inert atmosphere, such as argon and nitrogen, a reductive atmosphere containing hydrogen, or an oxidative atmosphere in the atmosphere. The calcination is carried out at a predetermined temperature and for a predetermined duration. The calcined materials may be, for example, pulverized, dispersed, and filtrated to obtain a desired fluorescent material powder. Solid-liquid separation may be carried out using industrially conventional methods, such as filtration, vacuum filtration, pressure-filtration, centrifugal separation, and decantation. Drying may be carried out using a conventional apparatus such as a vacuum-dryer, a hot-air dryer, a conical dryer, or a rotary evaporator.

Other Components

The fluorescence member may contain other components as necessary in addition to a fluorescent material and a resin. Examples of the other components include a filler, such as silica, barium titanate, titanium oxide, or aluminum oxide; a light stabilizer; and a colorant. When the fluorescence member includes other components, the amount of the other components to be contained for instance, when a filler is contained as another component, may be 0.01 part by mass to 20 parts by mass relative to 100 parts by mass of the resin.

EXAMPLES

Hereinafter, the Examples of the present disclosure will be specifically described, but the present disclosure is by no means limited to these Examples.

Before the production of the light emitting devices, fluorescent materials were prepared as follows.

As a first fluorescent material, Fluorescent material 1 having a composition represented by $SrLiAl_3N_4$:Eu was prepared. As a second fluorescent material, Fluorescent material 2 having a composition represented by $(Sr,Ca)AlSiN_3$:Eu was prepared. As a third fluorescent material, Fluorescent material 3a having a composition represented by $Y_3(Al,Ga)_5O_{12}$:Ce, and Fluorescent material 3b having a composition represented by $Lu_3Al_5O_{12}$:Ce were prepared. As a fourth fluorescent material, Fluorescent material 4a having a composition represented by $Ca_8MgSi_4O_{16}C_{12}$:Eu, Fluorescent material 4b having a composition represented by $Sr_4Al_{14}O_{25}$:Eu, and Fluorescent material 4c having a composition represented by $(Sr,Ba)_2SiO_4$:Eu were prepared.

Figure 3A:
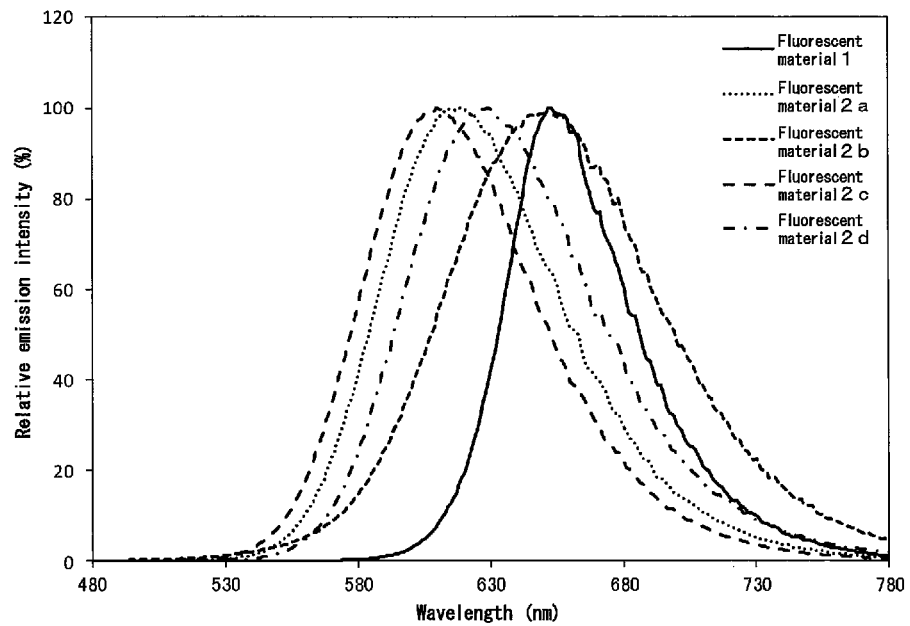
FIG. 3A is a graph illustrating light emission spectra of relative emission intensities versus wavelengths of Fluorescent material 1 and Fluorescent materials 2a to 2d according to the present embodiment.
Figure 3B:
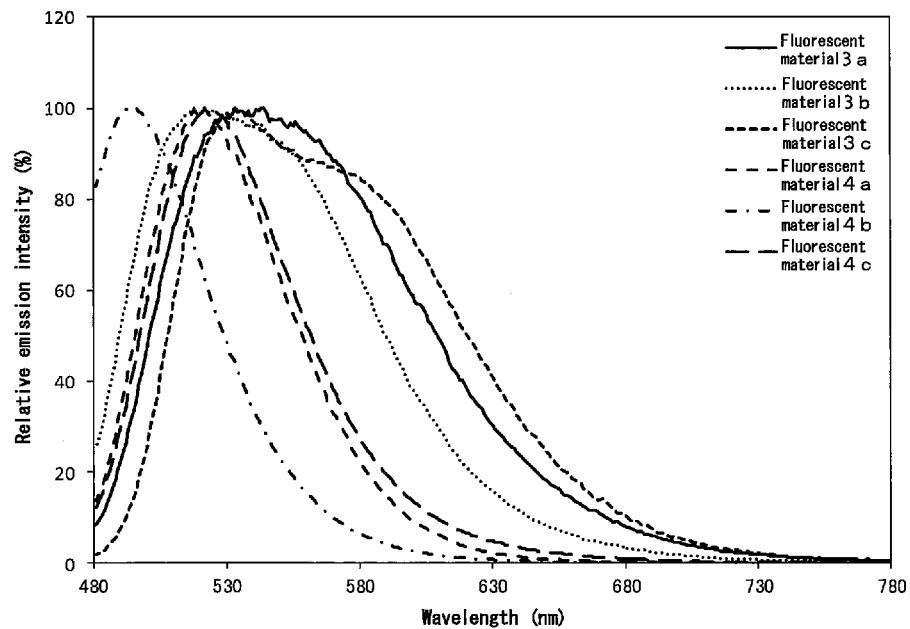
FIG. 3B is a graph illustrating light emission spectra of relative emission intensities versus wavelengths of Fluorescent materials 3a to 3c and 4a to 4c according to the present embodiment.

The peak emission wavelength and half bandwidth (wavelength width at an emission intensity corresponding to 50% of the maximum light emission intensity) of each of the prepared fluorescent materials are shown in Table 1. In connection with this, FIGS. 3A and 3B show the light emission spectra, each of which is relative emission intensity versus wavelength when the maximum light emission intensity of each fluorescent material excited at 460 nm is taken as 100%. Note that the half bandwidth of Fluorescent material 4b is a half bandwidth when excited at 400 nm because when Fluorescent material 4b is excited at 460 nm, the short wavelength side is affected by excitation light. For each of Fluorescent materials 2a to 2d, the ratio of the half bandwidth of the second fluorescent material to the half bandwidth of the first fluorescent material (Fluorescent material 1) is shown.

TABLE 1

| | Composition | Peak emission wavelength (nm) | Half bandwidth (nm) | Ratio of half bandwidth |
|---|---|---|---|---|
| Fluorescent material 1 | $SrLiAl_3N_4$:Eu | 653 | 53 | — |
| Fluorescent material 2a | $(Sr,Ca)AlSiN_3$:Eu | 619 | 78 | 0.68 |
| Fluorescent material 2b | $CaAlSiN_3$:Eu | 653 | 92 | 0.58 |
| Fluorescent material 2c | $(Sr,Ca)AlSiN_3$:Eu | 610 | 76 | 0.70 |
| Fluorescent material 2d | $(Sr,Ca)AlSiN_3$:Eu | 629 | 81 | 0.65 |
| Fluorescent material 3a | $Y_3(Al,Ga)_5O_{12}$:Ce | 543 | 108 | — |
| Fluorescent material 3b | $Lu_3Al_5O_{12}$:Ce | 522 | 100 | — |

TABLE 1-continued

| | Composition | Peak emission wavelength (nm) | Half bandwidth (nm) | Ratio of half bandwidth |
|---|---|---|---|---|
| Fluorescent material 3c | $La_3Si_6N_{11}$:Ce | 533 | 113 | — |
| Fluorescent material 4a | $Ca_8MgSi_4O_{16}Cl_2$:Eu | 522 | 63 | — |
| Fluorescent material 4b | $Sr_4Al_{14}O_{25}$:Eu | 493 | 60 | — |
| Fluorescent material 4c | $(Sr,Ba)_2SiO_4$:Eu | 523 | 65 | — |

Examples 1 to 4, Comparative Examples 1 and 2

Preparation of Light Emitting Devices

Light emitting devices were prepared as described below by combining a blue light emitting LED (light emitting element) having an emission wavelength of 454 nm in combination with a first fluorescent material, a second fluorescent material, and a third fluorescent material as shown in Table 2.

For each light emitting device, fluorescent materials mixed such that the chromaticity coordinates of mixed light emitted by the light emitting device were around x=0.450, y=0.400, was added to silicone resin, followed by mixing/dispersing and further defoaming to yield a fluorescent material-containing resin composition. Next, the resultant fluorescent material-containing resin composition was poured onto a light emitting element to fill the recess, followed by heating to cure the resin composition. Each light emitting device was prepared through these steps.

Figure 4:
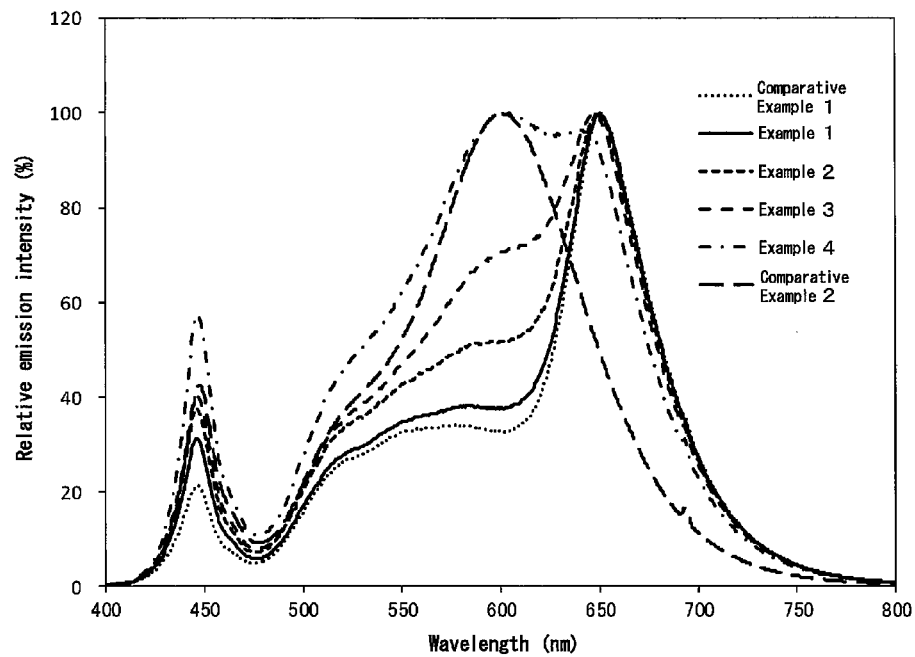
FIG. 4 is a graph illustrating light emission spectra of relative emission intensities versus wavelengths of light emitting devices according to Examples 1 to 4 and Comparative Examples 1 and 2.

FIG. 4 shows light emission spectra of the light emitting devices of Examples 1 to 4 and Comparative Examples 1 and 2. "First mass ratio (%)" in Table 2 indicates the mass ratio (%) of the first fluorescent material relative to the total mass of the first fluorescent material and the second fluorescent material. The chromaticity coordinates x, y indicate the chromaticity of each light emitting device. Ra indicates an average rendering index, and R9 indicates a special color rendering index as an indicator of redness. The luminous flux ratio is a relative luminous flux when the luminous flux of Comparative Example 1 is taken as a reference (100.0).

Comparative Example 1 is a light emitting device where only a first fluorescent material and a third fluorescent material were combined with no second fluorescent material, whereas Comparative Example 2 is a light emitting device where only a second fluorescent material and a third fluorescent material were combined with no first fluorescent material. Examples 1 to 4 were prepared such that the mass ratios of the first fluorescent materials were 90%, 70%, 50%, and 30%, respectively.

The luminous flux ratio becomes greater, that is, brighter as the ratio of the second fluorescent material increases or as the ratio of the first fluorescent material decreases. This is believed to be attributable to the following facts: since the peak emission wavelength of the second fluorescent material is on the shorter wavelength side than the peak emission wavelength of the first fluorescent material, as the ratio of the second fluorescent material increases, luminosity factor that affects luminous flux becomes higher. As for Ra and R9, when Fluorescent material 1 and Fluorescent material 2, which have different wavelengths from each other, are combined, the resultant value is generally considered to fall at a midpoint between the case where Fluorescent material 1 alone is used and the case where Fluorescent material 2 alone is used. As shown in the Examples, however, by combining fluorescent materials having a given difference in light emitting properties, the spectra of the light emitting devices vary among the Examples as shown in FIG. 4. As for the shapes of the red components at 550 nm to 700 nm, for instance, Examples 1, 2, and 3 each show smaller emission intensity at around 600 nm compared to Comparative Example 2, so that Examples 1, 2, and 3 have higher Ra and R9.

Comparative Examples 3 and 4

Preparation of Light Emitting Devices

Light emitting devices were prepared in the same manner as Example 1 except that Fluorescent material 2b, which has the same peak emission wavelength as that of Fluorescent material 1, was used in place of a first fluorescent material, and that the combination of the fluorescent materials was changed as shown in Table 3. Table 3 also shows the data of Comparative Example 2. The mass ratio (%) in the Table indicates the mass ratio (%) of Fluorescent material 2b relative to the total mass of Fluorescent material 2a and Fluorescent material 2b.

TABLE 2

| | First fluorescent material | Second fluorescent material | Third fluorescent material | First mass ratio (%) | Chromaticity coordinate x | y | Ra | R9 | Luminous flux ratio |
|---|---|---|---|---|---|---|---|---|---|
| Comparative Example 1 | Fluorescent material 1 | — | Fluorescent material 3a | 100 | 0.458 | 0.411 | 84.3 | 24.4 | 100.0 |
| Example 1 | Fluorescent material 1 | Fluorescent material 2a | Fluorescent material 3a | 90 | 0.447 | 0.397 | 86.9 | 41.6 | 106.4 |
| Example 2 | Fluorescent material 1 | Fluorescent material 2a | Fluorescent material 3a | 70 | 0.446 | 0.400 | 92.3 | 81.5 | 121.9 |
| Example 3 | Fluorescent material 1 | Fluorescent material 2a | Fluorescent material 3a | 50 | 0.458 | 0.401 | 91.8 | 78.3 | 133.5 |
| Example 4 | Fluorescent material 1 | Fluorescent material 2a | Fluorescent material 3a | 30 | 0.450 | 0.403 | 85.0 | 35.2 | 158.0 |
| Comparative Example 2 | — | Fluorescent material 2a | Fluorescent material 3a | 0 | 0.459 | 0.411 | 75.4 | −22.8 | 185.8 |

TABLE 3

| | First fluorescent material | Second fluorescent material | Third fluorescent material | mass ratio (%) | Chromaticity coordinate x | y | Ra | R9 | Luminous flux ratio |
|---|---|---|---|---|---|---|---|---|---|
| Comparative Example 2 | — | Fluorescent material 2a | Fluorescent material 3a | 0 | 0.459 | 0.411 | 75.4 | −22.8 | 185.8 |
| Comparative Example 3 | — | Fluorescent material 2a Fluorescent material 2b | Fluorescent material 3b | 30 | 0.459 | 0.410 | 79.7 | 1.5 | 167.2 |
| Comparative Example 4 | — | Fluorescent material 2a Fluorescent material 2b | Fluorescent material 3b | 50 | 0.459 | 0.410 | 82.6 | 19.8 | 155.1 |

Figure 5:
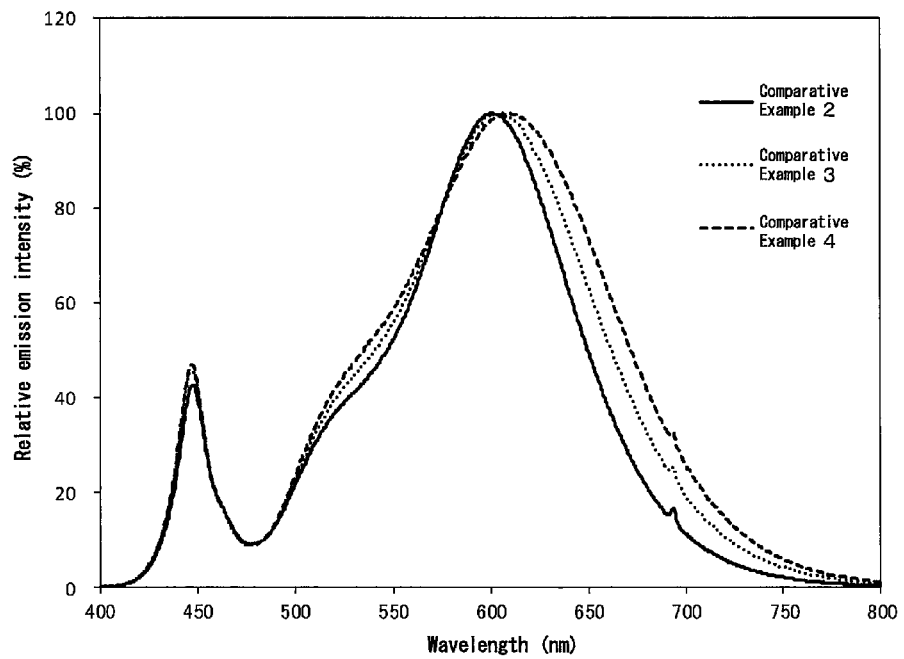
FIG. 5 is a graph illustrating light emission spectra of relative emission intensities versus wavelengths of light emitting devices according to Comparative Examples 2 to 4.

FIG. 5 shows the light emission spectra of the light emitting devices of Comparative Examples 2 to 4. Comparative Example 3 and 4 are combinations of Fluorescent material 2a and Fluorescent material 2b having different emission wavelengths. The ratio of the half bandwidth of Fluorescent material 2a to Fluorescent material 2b is 0.85, so that the half bandwidth ratio is greater than 0.8. Ra and R9 of these combinations are considered to vary merely by the fluorescent material ratio, and no improvement in color rendering is caused by any of these combinations. This can also be shown by the fact that almost no change in components around light emission spectra of 500 nm to 600 nm occurred as a result of changes in mixing ratio of fluorescent materials, as shown in the light emission spectra of FIG. 5. Merely the components on the longwave side longer than 600 nm moved further to the longwave side.

Examples 5 to 10, Comparative Examples 5 and 6

Preparation of Light Emitting Devices

Light emitting devices were prepared in the same manner as Example 1 except that the combinations of the first fluorescent material, the second fluorescent material, and the third fluorescent material were changed as shown in Table 4. "First mass ratio (%)" of Table 4 indicates the mass ratio (%) of the first fluorescent material relative to the total mass of the first fluorescent material and the second fluorescent material.

Comparative Example 5 is a case where only a second fluorescent material and a third fluorescent material were combined with no first fluorescent material, whereas Comparative Example 6 is a case where only a first fluorescent material and a third fluorescent material were combined with no second fluorescent material. In Examples 5 to 10, the fluorescent materials were mixed so that the mass ratio of the first fluorescent materials respectively account for 10%, 20%, 30%, 40%, 50%, and 70%.

Figure 6:
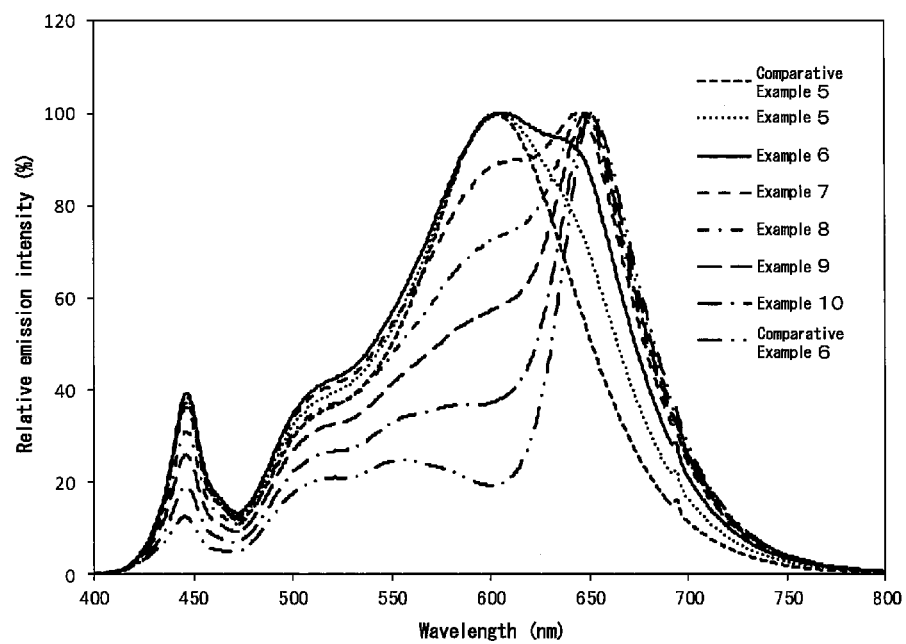
FIG. 6 is a graph illustrating light emission spectra of relative emission intensities versus wavelengths of light emitting devices according to Examples 5 to 10 and Comparative Examples 5 and 6.

Comparative Examples 5 and 6 have smaller Ra and R9 compared to those of Comparative Examples 1 and 2, respectively. In contrast, Examples 9 and 10 have higher Ra and R9 compared to those of Comparative Examples 1 and 2. The luminous flux ratio increases as the ratio of the second fluorescent material increases, i.e., as the ratio of the first fluorescent material decreases. As shown in FIG. 6, the light emission spectra of the light emitting devices of Examples 5 to 10 vary and show characteristic shapes of light emission spectra of the respective red components at 550 nm to 700 nm. That is, for instance, since the emission intensity of Example 8 at around 600 nm is smaller than that of Comparative Example 5, Example 8 is closer to the base light, demonstrating enhanced Ra and R9.

Example 11

A light emitting device was prepared in the same manner as Example 1 except that the combination of a first fluorescent material, a second fluorescent material, and a third fluorescent material was changed as shown in Table 5. Table 5 also shows the data of Comparative Example 1. "First mass ratio (%)" in Table 5 indicates the mass ratio (%) of the first fluorescent material relative to the total mass of the first fluorescent material and the second fluorescent material.

TABLE 4

| | First fluorescent material | Second fluorescent material | Third fluorescent material | First mass ratio (%) | Chromaticity coordinate x | y | Ra | R9 | Luminous flux ratio |
|---|---|---|---|---|---|---|---|---|---|
| Comparative Example 5 | — | Fluorescent material 2a | Fluorescent material 3b | 0 | 0.459 | 0.411 | 78.5 | −12.9 | 227.8 |
| Example 5 | Fluorescent material 1 | Fluorescent material 2a | Fluorescent material 3b | 10 | 0.459 | 0.410 | 83.2 | 13.0 | 209.6 |
| Example 6 | Fluorescent material 1 | Fluorescent material 2a | Fluorescent material 3b | 20 | 0.459 | 0.410 | 87.2 | 34.1 | 194.7 |
| Example 7 | Fluorescent material 1 | Fluorescent material 2a | Fluorescent material 3b | 30 | 0.459 | 0.410 | 91.5 | 57.3 | 180.7 |
| Example 8 | Fluorescent material 1 | Fluorescent material 2a | Fluorescent material 3b | 40 | 0.459 | 0.410 | 95.5 | 81.4 | 167.6 |
| Example 9 | Fluorescent material 1 | Fluorescent material 2a | Fluorescent material 3b | 50 | 0.459 | 0.410 | 96.8 | 90.7 | 152.0 |
| Example 10 | Fluorescent material 1 | Fluorescent material 2a | Fluorescent material 3b | 70 | 0.459 | 0.410 | 87.4 | 38.1 | 128.4 |
| Comparative Example 6 | Fluorescent material 1 | — | Fluorescent material 3b | 100 | 0.458 | 0.410 | 70.6 | −34.5 | 100.0 |

TABLE 5

| | First fluorescent material | Second fluorescent material | Third fluorescent material | First mass ratio (%) | Chromaticity coordinate | | Ra | R9 | Luminous flux ratio |
|---|---|---|---|---|---|---|---|---|---|
| | | | | | x | y | | | |
| Example 11 | Fluorescent material 1 | Fluorescent material 2b | Fluorescent material 3a | 30 | 0.459 | 0.411 | 92.6 | 87.1 | 120.4 |
| Comparative Example 1 | Fluorescent material 1 | — | Fluorescent material 3a | 100 | 0.458 | 0.411 | 84.3 | 24.4 | 100.0 |

Figure 7:
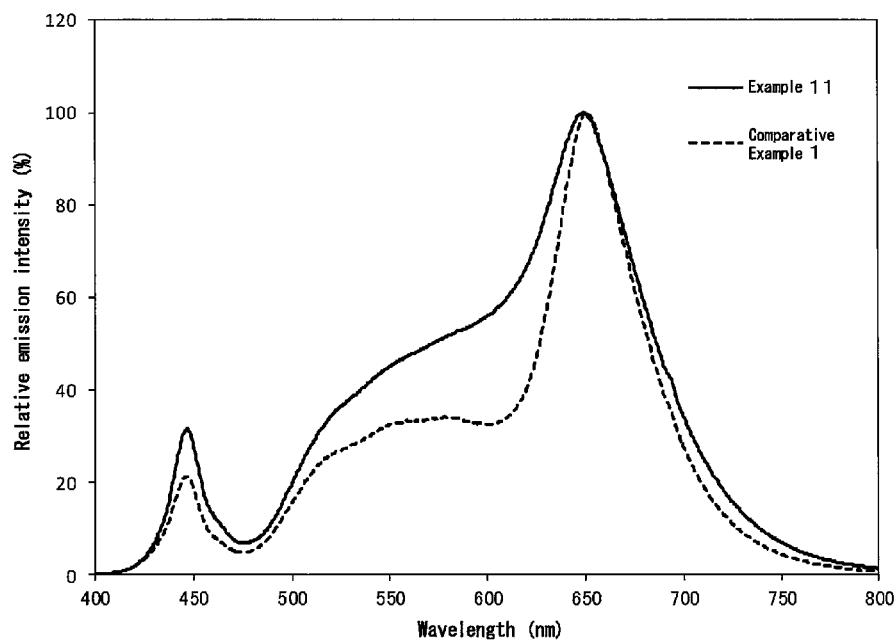
FIG. 7 is a graph illustrating light emission spectra of relative emission intensities versus wavelengths of light emitting devices according to Example 11 and Comparative Example 1.

The light emission spectra of the light emitting devices of Example 11 and Comparative Example 1 are shown in FIG. 7. Example 11, which includes a first fluorescent material and a second fluorescent material, has higher Ra and R9 compared to Comparative Example 1, which includes no second fluorescent material. The second fluorescent material of Example 11 is Fluorescent material 2b, which has a longer peak emission wavelength than Fluorescent material 2a of the above-described Examples, and similarly has an effect of enhancing color rendering. In this manner, even if the peak emission wavelength of the second fluorescent material is changed, the light emitting components at 500 nm to 630 nm can be adjusted by combining a first fluorescent material and a second fluorescent material, so that the resultant light emission spectrum is close to that of the base light, resulting in enhanced color rendering.

Examples 12 to 17

Preparation of Light Emitting Devices

Light emitting devices were prepared in the same manner as Example 1 except that the combinations of a first fluorescent material, a second fluorescent material, a third fluorescent material, and a fourth fluorescent material were changed as shown in Table 6. The mass ratios (%) of a fourth fluorescent material relative to a third fluorescent material referred to as "Fourth mass ratio (%)" are shown in Table 6. "First mass ratio (%)" of Table 6 indicates the mass ratio (%) of the first fluorescent material relative to the total mass of the first fluorescent material and the second fluorescent material.

Examples 12 to 17 each include a fourth fluorescent material in addition to the combination of fluorescent materials of Example 3. As a fourth fluorescent material, Examples 14 and 15 include Fluorescent material 4a, Examples 12 and 13 include Fluorescent material 4b, and Examples 16 and 17 include Fluorescent material 4c. The mass ratio of the fourth fluorescent material to the third fluorescent material is about 2 times of that of Example 12 in Example 13, about 2.5 times of that of Example 14 in Example 15, and about 2 times of that of Example 16 in Example 17.

Figure 8A:
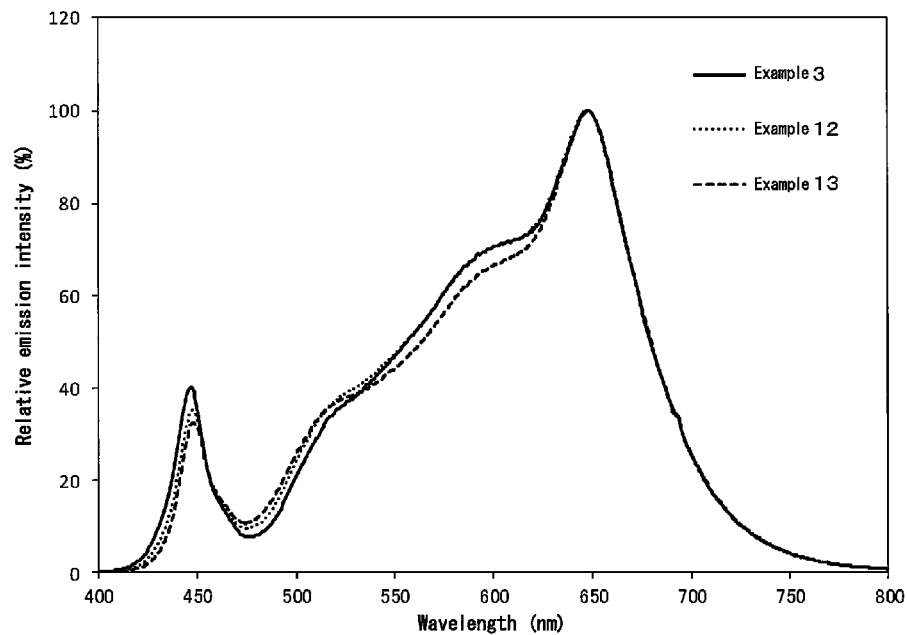
FIG. 8A is a graph illustrating light emission spectra of relative emission intensities versus wavelengths of light emitting devices according to Examples 3, 12, and 13.
Figure 8B:
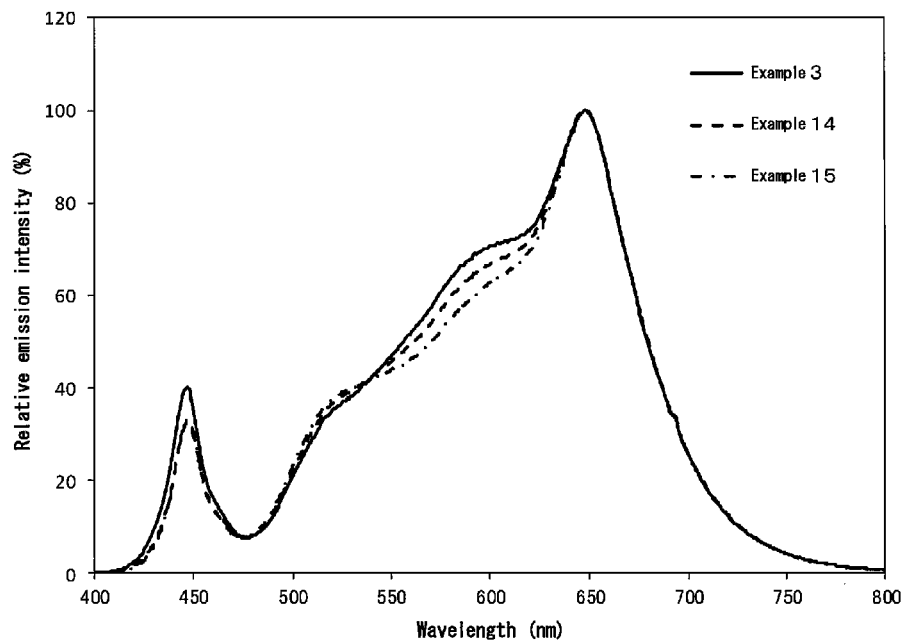
FIG. 8B is a graph illustrating light emission spectra of relative emission intensities versus wavelengths of light emitting devices according to Examples 3, 14, and 15.
Figure 8C:
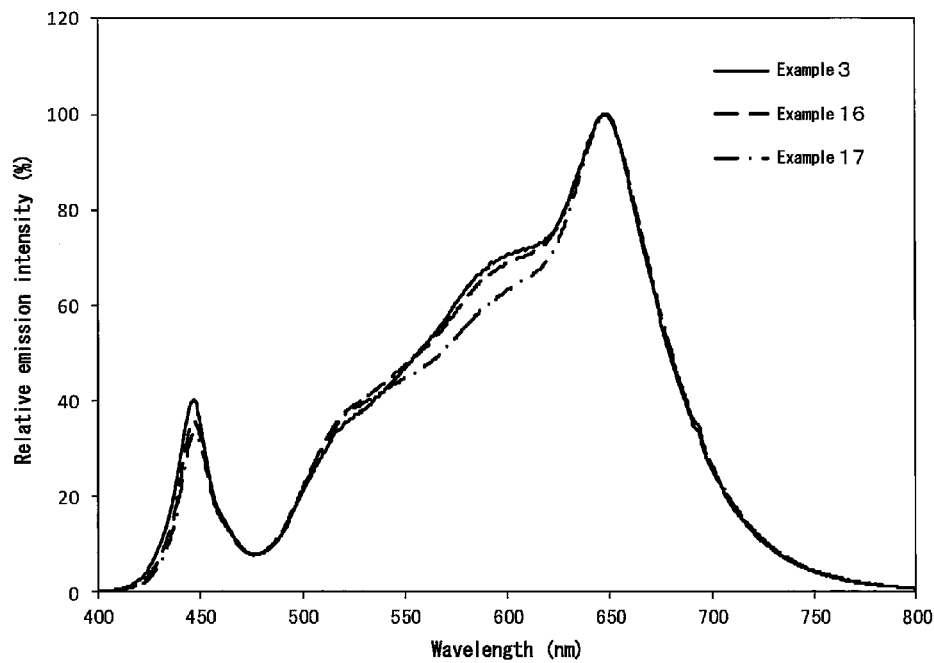
FIG. 8C is a graph illustrating light emission spectra of relative emission intensities versus wavelengths of light emitting devices according to Examples 3, 16, and 17.

Although Examples 12 to 17 each have a slightly lower luminous flux ratio than Example 3, Examples 12 to 17 have higher Ra and R9, and thus have higher color rendering. This is believed to be attributable, for instance, to the fact that since Fluorescent materials 4a and 4b have a peak emission wavelength on the shorter wavelength side than Fluorescent material 3a, as can be seen from the light emission spectra of the light emitting device of FIG. 8A to FIG. 8C, light emitting components at around 490 nm to 550 nm were increased and light emitting components of from 550 nm to 660 nm were decreased along with it, so that they become closer to the base light.

Examples 18 to 21, Comparative Examples 7 and 8

The light emitting devices of Examples 18 to 21 and Comparative Examples 7 and 8 were prepared in the same manner as Example 1 except that combinations of a first fluorescent material, a second fluorescent material, and a third fluorescent material were changed as shown in Table 7. "First mass ratio (%)" in Table 7 indicates mass ratio (%) of the first fluorescent material relative to the total mass of the first fluorescent material and the second fluorescent material.

TABLE 6

| | First fluorescent material | Second fluorescent material | Third fluorescent material | Fourth fluorescent material | First mass ratio (%) | Fourth mass ratio (%) | Chromaticity coordinate | | Ra | R9 | Luminous flux ratio |
|---|---|---|---|---|---|---|---|---|---|---|---|
| | | | | | | | x | y | | | |
| Example 3 | Fluorescent material 1 | Fluorescent material 2a | Fluorescent material 3a | — | 50 | — | 0.458 | 0.401 | 91.8 | 78.3 | 133.5 |
| Example 12 | Fluorescent material 1 | Fluorescent material 2a | Fluorescent material 3a | Fluorescent material 4b | 50 | 18.9 | 0.459 | 0.410 | 93.8 | 81.7 | 129.0 |
| Example 13 | Fluorescent material 1 | Fluorescent material 2a | Fluorescent material 3a | Fluorescent material 4b | 50 | 43.1 | 0.459 | 0.410 | 96.8 | 91.1 | 123.4 |
| Example 14 | Fluorescent material 1 | Fluorescent material 2a | Fluorescent material 3a | Fluorescent material 4a | 50 | 10.1 | 0.459 | 0.410 | 94.1 | 89.9 | 127.4 |
| Example 15 | Fluorescent material 1 | Fluorescent material 2a | Fluorescent material 3a | Fluorescent material 4a | 50 | 24.6 | 0.459 | 0.410 | 95.6 | 99.7 | 122.7 |
| Example 16 | Fluorescent material 1 | Fluorescent material 2a | Fluorescent material 3a | Fluorescent material 4c | 50 | 18.6 | 0.459 | 0.410 | 93.1 | 84.2 | 129.9 |
| Example 17 | Fluorescent material 1 | Fluorescent material 2a | Fluorescent material 3a | Fluorescent material 4c | 50 | 45.6 | 0.459 | 0.410 | 94.8 | 97.3 | 123.5 |

TABLE 7

| | First fluorescent material | Second fluorescent material | Third fluorescent material | First mass ratio (%) | Chromaticity coordinate | | Ra | R9 | Luminous flux ratio |
| --- | --- | --- | --- | --- | --- | --- | --- | --- | --- |
| | | | | | x | y | | | |
| Comparative Example 7 | — | Fluorescent material 2c | Fluorescent material 3b | 0 | 0.459 | 0.410 | 70.4 | −45.1 | 242.8 |
| Example 18 | Fluorescent material 1 | Fluorescent material 2c | Fluorescent material 3b | 30 | 0.459 | 0.410 | 89.7 | 56.5 | 178.1 |
| Example 19 | Fluorescent material 1 | Fluorescent material 2c | Fluorescent material 3b | 40 | 0.459 | 0.410 | 95.5 | 89.3 | 159.3 |
| Comparative Example 8 | — | Fluorescent material 2d | Fluorescent material 3b | 0 | 0.459 | 0.410 | 88.7 | 32.1 | 197.6 |
| Example 20 | Fluorescent material 1 | Fluorescent material 2d | Fluorescent material 3b | 30 | 0.459 | 0.410 | 96.0 | 75.2 | 170.3 |
| Example 21 | Fluorescent material 1 | Fluorescent material 2d | Fluorescent material 3b | 40 | 0.459 | 0.410 | 98.0 | 94.9 | 158.3 |

Figure 9A:
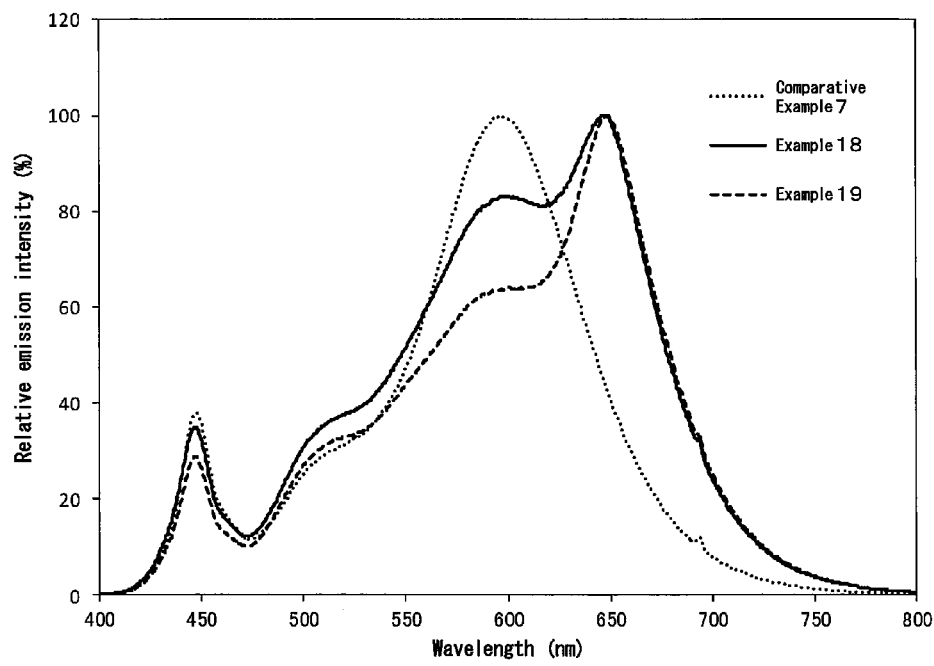
FIG. 9A is a graph illustrating light emission spectra of relative emission intensities versus wavelengths of light emitting device according to light emitting devices of Examples 18 and 19 and Comparative Example 7.
Figure 9B:
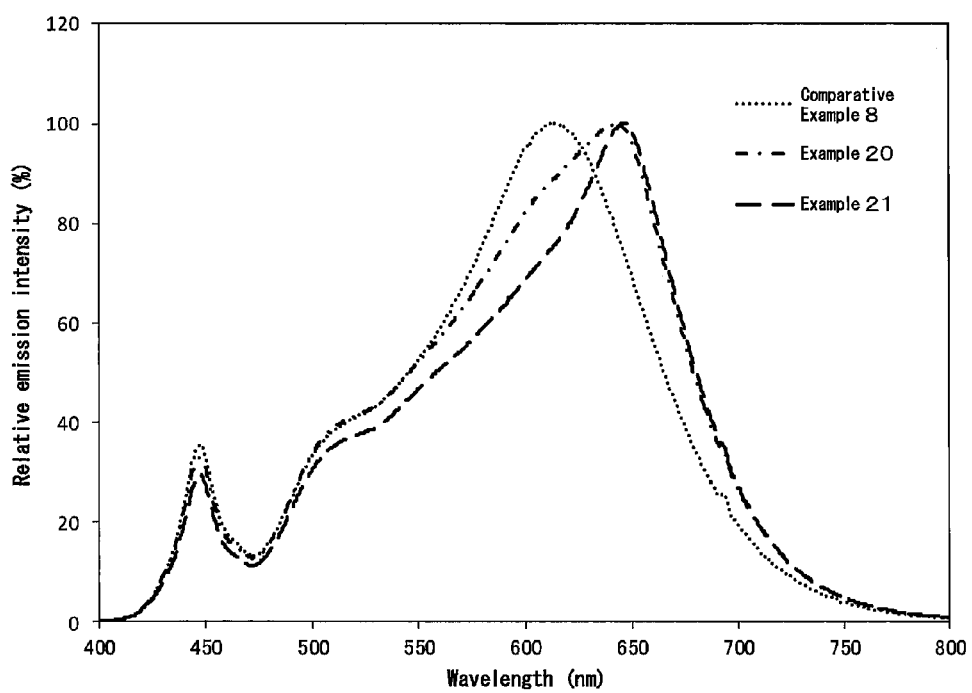
FIG. 9B is a graph illustrating light emission spectra of relative emission intensities versus wavelengths of light emitting devices according to Examples 20 and 21 and Comparative Example 8.

The light emission spectra of the light emitting devices of Examples 18 to 21 and Comparative Examples 7 and 8 are shown in FIGS. 9A and 9B.

Light emitting devices of Examples 18 to 21 were prepared using one of Fluorescent material 2c and Fluorescent material 2d, which are second fluorescent materials and different from each other in peak emission wavelength by about 20 nm, in combination with Fluorescent material 1 and Fluorescent material 3b. As for the reference of the luminous flux ratio, the luminous flux ratio of Comparative Example 6, which includes the same Fluorescent material 3b as these Examples, was taken as 100%. Fluorescent material 2c used in Examples 18 and 19 is a fluorescent material having a peak emission wavelength at 610 nm, which is about 10 nm shorter than the peak emission wavelength of Fluorescent material 2a. Fluorescent material 2c, however, demonstrates the effect of enhancing Ra and R9 by being combined with Fluorescent material 1. Fluorescent material 2d, which is used in Examples 20 and 21, is a fluorescent material having a peak emission wavelength at 629 nm and a longer wavelength than that of Fluorescent material 2a, also exhibited the effect of enhancing Ra and R9 like Fluorescent material 2c. Referring to the light emission spectra of FIGS. 9A and 9B, because all the Examples show a spectrum closer to that of the base light than Comparative Examples, they show higher color rendering. Comparison of Examples 18 and 19 and Examples 20 and 21 reveals difference in component ratio at around 570 nm to 630 nm, which corresponds to a second fluorescent material. Combinations of using Fluorescent material 2c, which has a shorter peak emission wavelength, are likely to have more components at around 580 to 600 nm, whereas use of a second fluorescent material having a longer peak emission wavelength (Fluorescent material 2d) is likely to result in higher Ra, R9 and luminous flux, leading to even superior light emitting properties.

As described above, the light emitting device according to the present disclosure achieves a light emission spectrum closer to that of the base light by combining red light-emitting first and second fluorescent materials having a ratio of a half bandwidth within a predetermined range and a different peak emission wavelength from each other, and a yellow light-emitting third fluorescent material. Because of this, the light emitting device according to the present disclosure not only achieves an improved color rendering, which is evaluated, for example, by an average rendering index, but also an improved luminosity factor. The light emitting device achieves even superior color rendering by combining a fourth fluorescent material, which emits green light, with the above-described fluorescent materials.

The light emitting device of the present disclosure can be suitably used as a light source for lighting, LED displays, backlight light sources, traffic signals, illuminated switches, various sensors, and various indicators, and thus has a high industrial value.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A light emitting device comprising:
  a light emitting element having a peak emission wavelength in a range of from 400 nm to 480 nm; and
  a fluorescent member comprising:
    a first fluorescent material that comprises a nitride containing alkaline-earth metal, alkali metal, aluminium and europium,
    a second fluorescent material that comprises a nitride containing alkaline-earth metal, aluminium, silicon and europium, and
    a third fluorescent material having a peak emission wavelength in a range of from 500 nm to 560 nm;
  wherein a content of the first fluorescent material relative to a total content of the first fluorescent material and the second fluorescent material is from 5% by mass to 95% by mass,
  wherein the first fluorescent material has a peak emission wavelength in a range of more than 640 nm and 670 nm or less,
  wherein the first fluorescent material has a peak emission wavelength equal to or greater than a peak emission wavelength of the second fluorescent material,
  wherein a ratio of a half bandwidth of a light emission spectrum of the first fluorescent material to a half bandwidth of a light emission spectrum of the second fluorescent material is from 0.5 to 0.8,
  wherein the fluorescent member further comprises a fourth fluorescent material having a peak emission wavelength in a range of 480 nm to 540 nm,
  wherein the fluorescent member further comprises a resin, wherein a content of the fourth fluorescent material is from 0.1 part by mass to 100 parts by mass, relative to 100 parts by mass of resin, and wherein a content of the fourth fluorescent material relative to a total content of the third fluorescent material in the fluorescent member is from 1% by mass to 200% by mass.

2. The light emitting device according to claim 1, wherein the first fluorescent material has a composition represented by formula (I), $$M^a{}_x M^b{}_y Al_3 N_z : Eu \qquad (I)$$

wherein $M^a$ is at least one element selected from the group consisting of Ca, Sr, Ba, and Mg; $M^b$ is at least one element selected from the group consisting of Li, Na, and K; and x, y, and z respectively satisfy $0.5 \le x \le 1.5$, $0.5 \le y \le 1.2$, and $3.5 \le z \le 4.5$.

3. The light emitting device according to claim 2, wherein $M^a$ comprises at least one of Ca and Sr; and $M^b$ comprises Li in formula (I).

4. The light emitting device according to claim 2, wherein x is from 0.7 to 1.2 in formula (I).

5. The light emitting device according to claim 1, wherein the second fluorescent material has a composition represented by formula (II), $$Sr_s Ca_t Al_u Si_v N_w : Eu \qquad (II)$$

wherein s, t, u, v, and w respectively satisfy $0.0 \le s < 1.0$, $0.0 < t \le 1.0$, $s+t \le 1.0$, $0.9 \le u \le 1.1$, $0.9 \le v \le 1.1$, and $2.5 \le w \le 3.5$.

6. The light emitting device according to claim 1, wherein a content of the first fluorescent material relative to a total content of the first fluorescent material and the second fluorescent material is from 40% by mass to 70% by mass.

7. The light emitting device according to claim 1, wherein the third fluorescent material has a light emission spectrum having a half bandwidth of from 90 nm to 125 nm.

8. The light emitting device according to claim 1, wherein the third fluorescent material comprises at least one fluorescent material having a composition represented by formula (IIIa) or (IIIb):

$$Ln_3 Al_{5-p} Ga_p O_{12} : Ce \qquad (IIIa)$$

wherein Ln is at least one element selected from the group consisting of Y, Lu, Gd, and Tb; and p satisfies $0.0 \le p \le 3.0$;

$$La_{3-q} Y_q Si_6 N_{11} : Ce \qquad (IIIb)$$

wherein q satisfies $0.0 \le q \le 1.5$.

9. The light emitting device according to claim 1, wherein the fourth fluorescent material has a light emission spectrum having a half bandwidth of from 40 nm to 80 nm.

10. The light emitting device according to claim 1, wherein the fourth fluorescent material comprises at least one fluorescent material having a composition represented by formula (IVa), (IVb), or (IVc):

$$M^c{}_8 Mg Si_4 O_{16} X_2 : Eu \qquad (IVa)$$

wherein $M^c$ is at least one element selected from the group consisting of Ca, Sr, and Ba;

and X is at least one element selected from the group consisting of Cl, F, and Br;

$$M^d{}_4 Al_{14} O_{25} : Eu \qquad (IVb)$$

wherein $M^d$ is at least one element selected from the group consisting of Ca, Sr, and Ba;

$$M^e{}_2 SiO_4 : Eu \qquad (IVc)$$

wherein $M^e$ is at least one element selected from the group consisting of Ca, Sr, Ba, and Mg.

11. The light emitting device according to claim 1, wherein the first fluorescent material, the second fluorescent material, and the third fluorescent material are arranged closer to the light emitting element in the recited order.

12. The light emitting device according to claim 1, wherein the first fluorescent material has a light emission spectrum having a half bandwidth that is from 40 nm or more to 70 nm.

13. The light emitting device according to claim 1, wherein a content of the third fluorescent material relative to a total content of the first fluorescent material and the second fluorescent material is more than 300% by mass to 1800% by mass.

14. The light emitting device according to claim 1, wherein the second fluorescent material has a peak emission wavelength in a range of 600 nm to 655 nm.

* * * * *